(12) United States Patent
Nick

(10) Patent No.: US 10,221,354 B2
(45) Date of Patent: Mar. 5, 2019

(54) LUMINESCENT PARTICLE, MATERIALS AND PRODUCTS INCLUDING SAME, AND METHODS

(71) Applicant: SAMSUNG ELECTRONICS CO., LTD, Suwon-si (KR)

(72) Inventor: Robert J. Nick, Pepperell, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 37 days.

(21) Appl. No.: 15/159,389

(22) Filed: May 19, 2016

(65) Prior Publication Data

US 2017/0066963 A1    Mar. 9, 2017

Related U.S. Application Data

(63) Continuation of application No. PCT/US2014/066461, filed on Nov. 19, 2014.

(Continued)

(51) Int. Cl.

| | | |
|---|---|---|
| C03C 3/04 | (2006.01) |
| C03C 4/12 | (2006.01) |
| C03C 14/00 | (2006.01) |
| C03C 17/02 | (2006.01) |
| C09K 11/02 | (2006.01) |

(Continued)

(52) U.S. Cl.
CPC ............ *C09K 11/025* (2013.01); *C03C 3/04* (2013.01); *C03C 4/12* (2013.01); *C03C 14/006* (2013.01); *C03C 17/02* (2013.01); *C09K 11/02* (2013.01); *C09K 11/08* (2013.01); *H01L 33/502* (2013.01); *H01L 33/56* (2013.01)

(58) Field of Classification Search
CPC ....... C09K 11/25; C09K 11/08; C09K 11/025; C03C 4/12; C03C 3/06; C03C 3/04; C03C 14/006

See application file for complete search history.

(56) References Cited

U.S. PATENT DOCUMENTS 5,091,115 A    2/1992 Nogami
6,322,901 B1    11/2001 Bawendi et al.
(Continued)

FOREIGN PATENT DOCUMENTS

| | | |
|---|---|---|
| CN | 101805602 A | 8/2010 |
| JP | 08188411 A | 7/1996 |

(Continued)

OTHER PUBLICATIONS

Brown, et al., "Optimization of the Preparation of Glass-Coated, Dye-Tagged Metal Nanoparticles as SERS Substrates", Langmuir, (2008), vol. 24, pp. 2178-2185.

(Continued)

*Primary Examiner* — C Melissa Koslow
(74) *Attorney, Agent, or Firm* — Cantor Colburn LLP

(57) ABSTRACT

A luminescent particle including a surface comprising glass that surrounds one or more particles of one or more light emissive materials is disclosed. Preferably the surface comprises a vitrified glass. Methods form making a luminescent particle including a surface comprising glass that surrounds one or more particles of one or more light emissive materials is also disclosed. Compositions and products including a luminescent particle are further disclosed.

13 Claims, 2 Drawing Sheets

Related U.S. Application Data

(60) Provisional application No. 61/906,380, filed on Nov. 19, 2013.

(51) Int. Cl.
*C09K 11/08* (2006.01)
*H01L 33/50* (2010.01)
*H01L 33/56* (2010.01)

(56) References Cited

U.S. PATENT DOCUMENTS

| | | | |
|---|---|---|---|
| 6,586,190 B2* | 7/2003 | Bernasconi | B82Y 5/00 435/174 |
| 6,600,175 B1 | 7/2003 | Baretz et al. | |
| 6,608,332 B2 | 8/2003 | Shimizu et al. | |
| 6,869,864 B2 | 3/2005 | Yim et al. | |
| 7,723,100 B2 † | 5/2010 | Natan | |
| 8,360,617 B2 | 1/2013 | Gillies et al. | |
| 8,718,437 B2 | 5/2014 | Coe-Sullivan et al. | |
| 8,921,827 B2 | 12/2014 | Pickett et al. | |
| 8,957,401 B2 | 2/2015 | Pickett et al. | |
| 9,011,720 B2 | 4/2015 | Aitken et al. | |
| 9,198,258 B2 | 11/2015 | Kim et al. | |
| 9,223,081 B2 | 12/2015 | Oh et al. | |
| 9,272,497 B2 | 3/2016 | Khadilkar et al. | |
| 9,297,502 B2 | 3/2016 | Yoon et al. | |
| 2005/0152824 A1 | 7/2005 | Kear et al. | |
| 2007/0241661 A1 | 10/2007 | Yin | |
| 2009/0108235 A1* | 4/2009 | Ando | C09K 11/02 252/301.6 S |
| 2010/0051898 A1 | 3/2010 | Kim et al. | |
| 2010/0129455 A1* | 5/2010 | Murase | A61K 31/192 424/489 |
| 2010/0177496 A1* | 7/2010 | Gillies | F21K 9/232 362/84 |
| 2010/0265307 A1 | 10/2010 | Linton et al. | |
| 2011/0103064 A1 | 5/2011 | Coe-Sullivan et al. | |
| 2011/0186811 A1 | 8/2011 | Coe-Sullivan et al. | |
| 2012/0113671 A1 | 5/2012 | Sadasivan et al. | |
| 2013/0011551 A1 † | 1/2013 | Zhou et al. | |
| 2013/0115441 A1 | 5/2013 | Bookbinder et al. | |
| 2013/0189803 A1* | 7/2013 | Nasaani | C09K 11/02 438/27 |
| 2014/0027673 A1 | 1/2014 | Nick et al. | |
| 2015/0179900 A1 | 6/2015 | Pickett et al. | |

FOREIGN PATENT DOCUMENTS

| | | |
|---|---|---|
| JP | 11349340 A | 12/1999 |
| JP | 2002173675 A | 6/2002 |
| JP | 2002544365 A | 12/2002 |
| JP | 2005344025 A | 12/2005 |
| JP | 2008007779 A | 1/2008 |
| WO | 01/37291 A1 † | 5/2001 |
| WO | 01/71732 A2 † | 9/2001 |
| WO | 2007034877 A1 | 3/2007 |
| WO | 2009035657 A1 | 3/2009 |
| WO | 2010129350 A2 | 11/2010 |
| WO | 2010129374 A2 | 11/2010 |
| WO | 2012/078820 A2 † | 6/2012 |
| WO | 2012147429 A1 | 11/2012 |

OTHER PUBLICATIONS

Chinese Office Action-Chinese Application 201480073494.4 dated Apr. 25, 2017, citing references listed within.
Dabbousi et al., "(CdSe)AnS Core-Shell Quantum Dots: Synthesis and Characterization of a Size Series of Highly Luminescent Nanocrystallites"; J. Phys. Chem. B.; 1997; 101; 9463-9475.
International Search Report dated Feb. 27, 2015; International Application No. PCT/US2014/066461; International Filing Date Nov. 19, 2014 (5 pages).
Mulvaney et al., "Glass-Coated, Analyte-Tagged Nanoparticles: A New Tagging System Based on Detection with Surface-Enhanced Raman Scattering", Langmuir, (2003), vol. 19, pp. 4784-4790.
Written Opinion dated Feb. 27, 2015; International Application No. PCT/US2014/066461; International Filing Date Nov. 19, 2014 (13 pages).
Dae Soo Jung, et al., "Design of particles by spray pyrolysis and recent progress in its application", Korean Journal of Chemical Engineering, vol. 27, No. 6, (2010), pp. 1621-1645.
Extended European Search Report—European Application No. 14864063.4 dated Jun. 28, 2017, citing references listed within.
Y. S. Wang, et al., "Sharp photoluminescence of CdSeS nanocrystals embedded in silica glass", Applied Physics Letters, vol. 82, No. 1, (Jan. 6, 2003), pp. 49-51.
Yang, et al., "Photoluminescence of Ge nanoparticles embedded in SiO2 glasses fabricated by a sol-gel method", Applied Physics Letters, vol. 81, No. 27, (Dec. 30, 2002), pp. 5144-5146.
Wang et al., Sharp photoluminescence of Cd5eS nanocrystals embedded in silica glass, Applied Physics Letters 82, 49, pp. 49-51, (Jan. 6, 2003).†
Cabal et al., Nanocomposites of silver nanoparticles embedded inglass nanofibres obtained by laser spinning, Nanoscale, pp. 1-6, (Mar. 12, 2013).†
Rotzetter et al., Sintering of coreshell Ag/glass nanoparticles: metal percolation at the glass transition temperature yields metal/glass/ceramic composites, Journal of Materials Chemistry, pp. 7769-7775, (Aug. 6, 2010).†

\* cited by examiner
† cited by third party

LUMINESCENT PARTICLE, MATERIALS AND PRODUCTS INCLUDING SAME, AND METHODS

This application is a continuation of International Application No. PCT/US2014/066461, filed 19 Nov. 2014, which was published in the English language as International Publication No. WO 2015/077372 on 28 May 2015, which International Application claims priority to U.S. Provisional Patent Application No. 61/906,380, filed on 19 Nov. 2013. Each of the foregoing is hereby incorporated herein by reference in its entirety for all purposes.

TECHNICAL FIELD OF THE INVENTION

The present invention relates to the field of luminescent materials, including luminescent materials including nanomaterials.

BACKGROUND OF THE INVENTION

It would represent an advance in the art to improve luminescent particles for use in remote, and proximity lighting and displays. It would represent a further advance in the art to improve luminescent particles including nanomaterials for use in remote and proximity lighting and displays.

SUMMARY OF THE INVENTION

The present invention relates to luminescent particles useful in remote and proximity lighting and displays, methods for making such luminescent particles, luminescent materials including such luminescent particles, and optical components, and other products including such luminescent particles or materials.

In accordance with one aspect of the present invention, there is provided a luminescent particle including a surface comprising glass that surrounds one or more particles of one or more light emissive materials. A light emissive material can comprise a combination of two or more light emissive materials. A light emissive material can comprise a light emissive nanomaterial. Examples of such light emissive nanomaterials include, but are not limited to, quantum dots and nanophosphors.

A glass is preferably optically transparent.

Preferably the glass coating is free or substantially free of graphitization by-products.

In certain aspects, a luminescent particle in accordance with the present invention can further comprise one or more particles of one or more light emissive materials and/or light emissive nanomaterials distributed in glass.

In certain aspects, a luminescent particle in accordance with the present invention includes two or more particles of one or more light emissive materials.

In accordance with another aspect of the present invention, there is provided a luminescent material comprising a luminescent particle described herein.

In accordance with a further aspect of the present invention, there is provided a method for making a luminescent particle including a surface comprising glass that surrounds one or more particles of one or more light emissive materials, the method comprising suspending one or more particles of one or more light emissive materials including a precursor for forming a glass on at least a portion of an outer surface of at least a portion of the one or more of one or more light emissive materials in a carrier stream, and pyrolyzing the precursor on the at least a portion of an outer surface of at least a portion of the one or more of one or more light emissive materials suspended in the carrier stream to convert the precursor to glass to form the luminescent particle.

A light emissive material can comprise a combination of two or more light emissive materials. A light emissive material can comprise a light emissive nanomaterial. Examples of such light emissive nanomaterials include, but are not limited to, quantum dots and nanophosphors.

The pyrolizing step can be at least partially carried out in a pyrolysis furnace.

The pyrolizing step can comprise flame pyrolysis.

Preferably, the pyrolizing step is carried out to form a glass coating that is free or substantially free of graphitization by-products.

A glass is preferably optically transparent.

Preferably the glass is free or substantially free of graphitization by-products.

In accordance with yet a further aspect of the present invention, there is provided a luminescent particle prepared by a method described herein.

In accordance with yet another aspect of the present invention, there is provided an optical component comprising a luminescent particle described herein.

In accordance with yet another aspect of the present invention, there is provided a light emitting device comprising a luminescent particle described herein.

In accordance with yet another aspect of the present invention, there is provided a light emitting device comprising a backlighting unit comprising a luminescent particle described herein.

In accordance with yet another aspect of the present invention, there is provided a backlighting unit comprising a luminescent particle described herein.

In accordance with yet another aspect of the present invention, there is provided a display comprising a luminescent particle described herein.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

Figure 1:
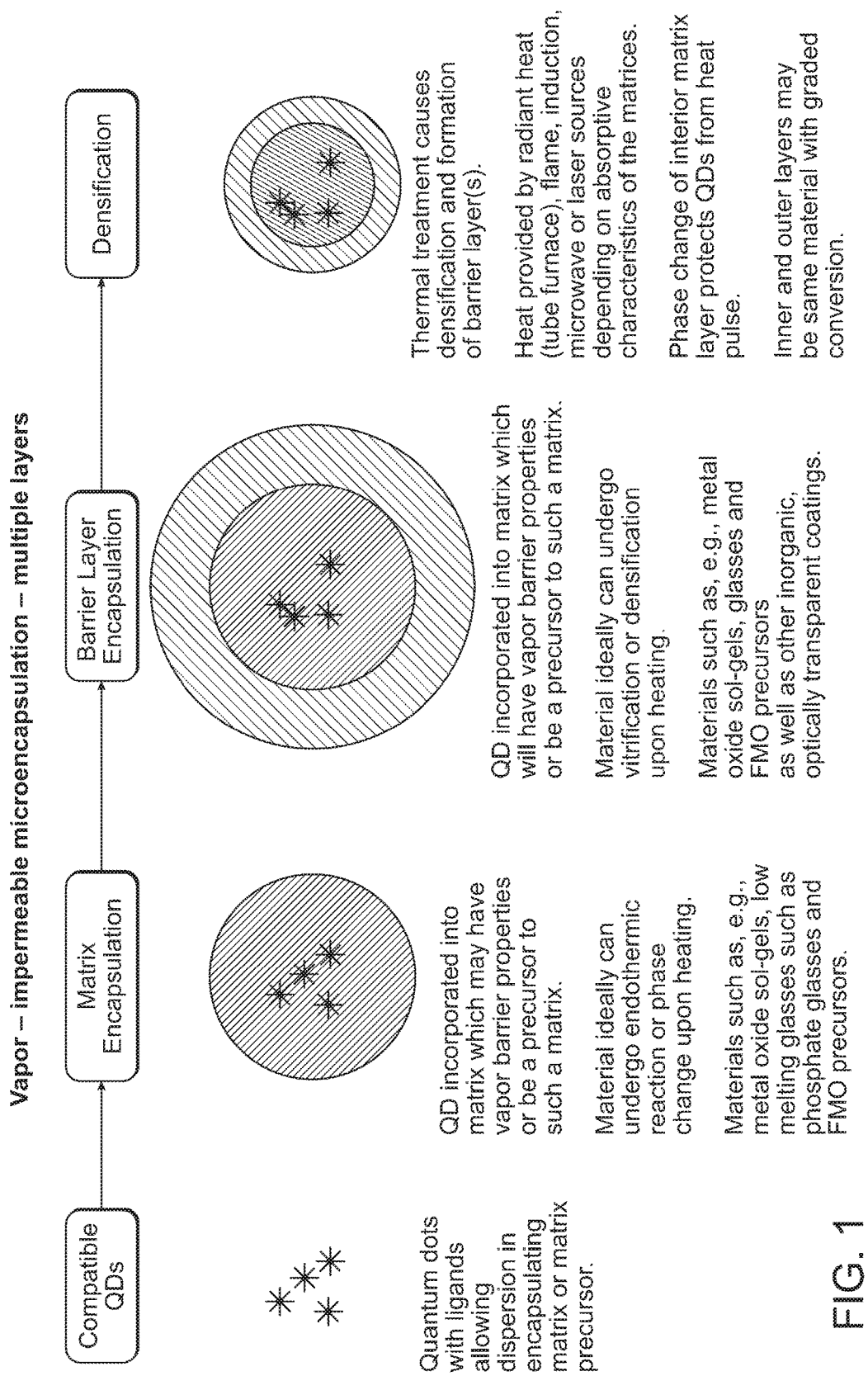
FIG. 1 outlines the steps of a method for vapor-impermeable microencapsulation of quantum dots including more than one barrier layer in accordance with the present invention.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention, there is provided luminescent particle including a surface comprising glass that surrounds one or more particles of one or more light emissive materials. A light emissive material can comprise a combination of two or more light emissive materials. A light emissive material can comprise an inorganic photoluminescent material. Examples of inorganic photoluminescent materials include, without limitation, inorganic phosphors. A light emissive material can comprise a light emissive nanomaterial. Examples of such light emissive nanomaterials include, but are not limited to, quantum dots and nanophosphors. Preferably, one or more particles of one or more light emissive nanomaterials comprise inorganic semiconductor nanocrystals.

The glass preferably comprises an optically transparent glass. Preferably the glass is free or substantially free of graphitization by-products.

A luminescent particle of the present invention can be included in lighting and display applications. For example, a luminescent particle in accordance with the present invention can be included in a luminescent material, an optical component, an inorganic semiconductor light emitting device (LED) or other light emitting device, a backlighting unit, and/or a display.

The surface comprising glass included in the luminescent particle described herein can provide an hermetic barrier around the one or more particles of one or more light emissive materials included in the luminescent particle. Such barrier can prevent oxidation of the one or more particles. Such prevention can further reduce or slow down, or ideally prevent any subsequent loss of down conversion ability. The surface comprising glass can also protect light emissive particles and/or light emissive nanoparticles included in a luminescent particle from harmful species they may encounter in an end-use application in which the luminescent particle is included. For example, if a luminescent particle is included in a silicone encapsulant for an LED, the glass coating can protect the light emissive particles and/or light emissive nanoparticles included in a luminescent particle from acid(s) present in the silicone encapsulant. The surface comprising glass can also prevent agglomeration and Ostwald ripening of the light emissive particles that are nano-sized that can be included in a luminescent particle by, e.g., limiting diffusion of nanoparticles.

Preferably, the surface comprising glass provides a barrier to the diffusion of oxygen gas or water vapor into the luminescent particle to the one or more particles of one or more light emissive materials or nanomaterials, providing a luminescent particle that can be stable in air. This can be particularly advantageous for applications in which the luminescent particle includes air-sensitive particles of one or more light emissive materials or nanomaterials in which the luminescent particles is exposed to highlight flux and/or high temperature in an environment that includes oxygen. One example of such application includes use in color down conversion of high flux light LEDs, which can operate at high temperatures.

A luminescent particle may further include a host material or body in which the one or more particles of one or more light emissive materials and/or nanomaterials are included, with the surface comprising glass being disposed over the outer surface of the host material or body that includes the one or more particles.

Examples of host materials, such as can be included in luminescent particle described herein, can include, but are not limited to, polymers, oligomers, monomers, resins, binders, glasses, metal oxides, and other non-polymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like.

Other examples of host materials can include, but are not limited to, a photo-curable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

Other examples of host materials can include, but are not limited to, a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Other suitable host materials can be identified by persons of ordinary skill in the relevant art. Selection of a host material can depend on the intended end-use application for the luminescent particle.

The total amount of light emissive particles or nanoparticles included in a host material in a luminescent particle can vary depending upon the intended end-use application. In certain aspects, for example, the amount of nanoparticles can be in a range from about 0.05 to about 10 weight percent of the host material, e.g., from about 0.05 weight percent to about 5 weight percent, from about 0.1 weight percent to about 5 weight percent. Although amounts within or outside of such range may also be useful based on the intended application.

Other additives (e.g., but not limited to, light scattering particles, etc.) may also be included in the luminescent particle.

In certain aspects, the glass can have a $T_g$ (glass transition temperature) that is substantially below the lattice melting temperature of the one or more particles of one or more light emissive materials or nanomaterials included in the luminescent particle.

In accordance with a further aspect of the present invention, there is provided a method for making a luminescent particle including a surface comprising glass that surrounds one or more particles of one or more light emissive materials, the method comprising suspending one or more particles of one or more light emissive materials including a precursor for forming a glass on at least a portion of an outer surface of at least a portion of the one or more of one or more light emissive materials in a carrier stream, and pyrolyzing the precursor on the at least a portion of an outer surface of at least a portion of the one or more of one or more light emissive materials suspended in the carrier stream to convert the precursor to glass to form the luminescent particle.

The method can further comprise contacting one or more particles of one or more light emissive materials and/or nanomaterials with a precursor for forming a glass to dispose the precursor on at least a portion of an outer surface of at least a portion of the one or more of one or more light emissive materials and/or nanomaterials.

Such contacting step can optionally comprise coating the one or more particles of one or more light emissive materials and/or nanomaterials with a coating material including a precursor for forming a glass. For example, a liquid including a precursor for forming a glass can be applied to the one or more particles of one or more light emissive materials and/or nanomaterials by mixing, by spray coating, or other available techniques selected by the skilled artisan. The precursor may also be applied in a solid form, e.g., as a powder (e.g., but not limited to, a fumed metal oxide powder) to the one or more particles of one or more light emissive materials and/or light emissive nanomaterials.

Such contacting step can optionally comprise encapsulating the one or more particles of one or more light emissive materials and/or nanomaterials in a precursor for forming a glass to form a precursor body in which the one or more particles are included. Such precursor body can, for example, be solid or porous. (It is possible that one or more of the particles are at the surface of the body and may not be fully covered by the precursor.) Examples of precursors used to so encapsulate one or more particles of one or more light emissive materials and/or nanomaterials to form a precursor body include, but are not limited to, aerogels, xerogels, and other sol-gel particles with low bulk densities. Preferably such aerogels, xerogels, and other sol-gel particles comprise silica or other vitrifiable metal oxides. Such other vitrifiable metal oxides can be readily identified by one of ordinary skill in the art. Examples of other precursors in which the one or more light emissive materials and/or nanomaterials in a precursor can be encapsulated include, but are not limited to, phase change materials, such as $P_2O_5$, and other lower melting glass that will absorb heat by undergoing a phase change.

Additional examples of precursors for forming a glass that can be used in the present method include, but are not limited to, a phosphate or silicate glass, a silicate body or mesolith or sol-gel or an organic glass with high temperature stability properties.

In accordance with a method described herein, one or more particles of one or more light emissive materials and/or nanomaterials including a precursor for forming a glass on at least a portion of an outer surface thereof are suspended in a carrier stream and the precursor on the one or more particles of one or more light emissive materials and/or nanomaterials is pyrolyzed to convert the precursor to glass to form the luminescent particle including a surface comprising glass that surrounds one or more particles of one or more light emissive materials.

The carrier stream can be used to transport the one or more particles of one or more light emissive materials and/or nanomaterials including the precursor to the flame or furnace in which the precursor is converted to glass by pyrolysis.

The carrier stream can comprise an inert gas. Examples include, but are not limited to, nitrogen and argon, etc. The carrier stream can also include a supercritical fluid such as $CO_2$. The carrier stream can further include a carrier solvent which will be removed as part of the pyrolysis or combustion process. If a carrier solvent comprises an organic solvent, the oxygen balance is preferably controlled by introduction of an air stream or oxidant to prevent graphitization during pyrolysis.

A carrier can also comprise a metal oxide precursor such as TEOS, $SiCl_4$, $SiH_4$ or another reactive metal oxide precursor that can coat at least a portion of an outer surface of the one or more particles of one or more light emissive material and/or light emissive nanomaterials (which may further be included in a host material or body) and vitrify to form a vitreous glass during the pyrolysis step. In some cases, water or oxygen may need to be introduced into the carrier stream to afford conversion of such precursors to the oxides.

Optionally a glass can be formed from more than one precursor.

Entrainment of the solid particles or aerosolization of a solution of the solid particles can be done, for example, but not limited to, via ultrasonic nebulization or pneumatic or hydraulic atomization to render a particle which will reduce to a pyrolyzed or vitrified particle of approximately 200 microns average size or less. Larger particles may also be generated that can optionally be later comminuted. Examples of comminution techniques that can be used include, but are not limited to, ball mill, jet mill or another known particle reduction technique.

The pyrolizing step can comprise passing a carrier stream including one or more particles of one or more light emissive materials and/or nanomaterials including a precursor for forming a glass on at least a portion of an outer surface thereof through a tube furnace such as a Lindberg furnace with a residence time sufficient to cause the precursor to fuse around at least a portion, and preferably all of the outer surface of the one or more particles to be contained within the luminescent particle. It is possible that not all of the precursor will be fully vitrified. Some of the unreacted or unvitrified precursor on a particle surface, however, may also protect the particle from thermal damage by undergoing an endothermic phase change or reaction in the furnace. For example, surrounding one or more particles with a low melting phosphate glass will allow the heat used to vitrify an outer coating of silicate body or mesolith to partially fuse, minimizing the heat pulse reaching the light emissive particle or nanoparticles.

The pyrolyzing step can alternatively comprise passing a carrier stream (preferably a gas stream) including one or more particles of one or more light emissive materials and/or nanomaterials including a precursor for forming a glass on at least a portion of an outer surface thereof through a burner flame, where the precursor is converted into glass.

For example, the one or more particles of one or more light emissive materials and/or nanomaterials including a precursor for forming a glass on at least a portion of an outer surface thereof ("precursor particle stream") is fed into a burner nozzle. The burner nozzle may be composed of multiple annuli. In one case, the precursor particle stream is in the center annulus. The outer two annuli supply respectively the $H_2$ and Oxygen (or air) needed for combustion. Alternatively, the precursor stream can be introduced at right angles to the flame as well, in a cooler zone.

A hot gas stream including luminescent particles after the pyrolysis step are preferably cooled before being recovered or collected. For example, luminescent particles can exit a pyrolysis furnace or flame and further pass through a heat exchanger to reduce the temperature of the stream to a temperature. For example, if the one or more particles of light emissive material included in luminescent particles include quantum dots, the temperature is preferably reduced to a temperature at which the quantum dot(s) will not be adversely affected, e.g. <400° C., <350° C., <320° C. Depending on the particular quantum dot(s), other temperatures may be selected. Preferably, the temperature will also be kept high enough so that any condensable by-products of the pyrolysis process will remain in the vapor state until the luminescent particles are separated from the reaction stream.

The method can further include collecting the luminescent particles. Collection of the luminescent particles can comprise collection by a bag filter, electrostatic precipitator, or spray condenser for later solid/liquid separation on a filter or centrifuge. Other suitable known powder collection techniques can be readily ascertained by the skilled artisan.

Optionally, an embodiment of a method taught herein can comprise forming one or more particles comprising one or more light emissive materials and/or nanomaterials QDs) incorporated into a matrix (or a host material (e.g., a host material described herein), suspending the one or more of the particles including a precursor for forming a glass on at least a portion of an outer surface of at least a portion of the particles in a carrier stream, and pyrolyzing the precursor on the at least a portion of an outer surface of at least a portion of the one or more suspended in the carrier stream to convert the precursor to glass to form a luminescent particle.

FIG. 1 outlines the steps of an embodiment of an example of a method described herein. (A method for making a luminescent particle including a surface comprising glass that surrounds one or more particles of one or more light emissive materials and/or nanomaterials described herein advantageously can provide vapor-impermeable microencapsulation of the light emissive materials and/or nanomaterials.) While the method outlined in FIG. 1 refers quantum dots (QDs), the same steps can also be carried with any of the other light emissive materials and/or nanomaterials described herein. The Matrix Encapsulation step can comprise forming one or more particles including one or more light emissive materials and/or nanomaterials (e.g., QDs) incorporated into a matrix. Such matrix can comprise, e.g, a host material described herein. Such particles can have, for example, a smallest dimension in a range from about 0.5 to about 200 microns. Such particles are then exposed to a precursor for forming a glass on the outer surface of one or more of such particles. (In the Barrier Layer Encapsulation step of the figure, the precursor is referred to as "matrix".) The densification step comprises treating (e.g., thermally treating) the particles surrounded by the precursor to densify or vitrify at least the outer surface of precursor surrounding the particle. Preferably all of the precursor surrounding the particle is vitrified or densified.

Figure 2:
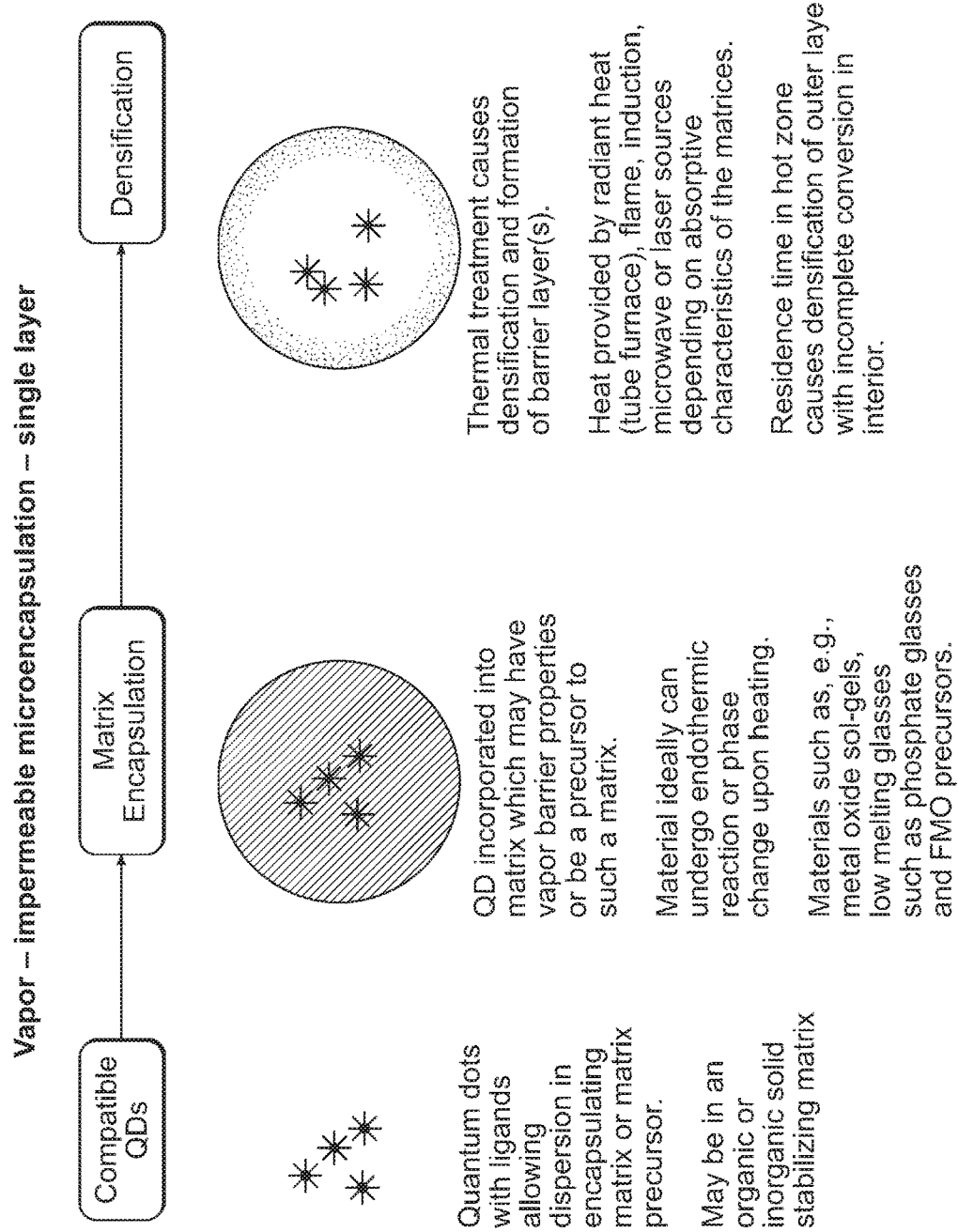
FIG. 2 outlines the steps of a method for vapor-impermeable microencapsulation of quantum dots including one barrier layer in accordance with the present invention.

FIG. 2 outlines the steps of an embodiment of another example of a method described herein. (A method for making a luminescent particle including a surface comprising glass that surrounds one or more particles of one or more light emissive materials and/or nanomaterials described herein advantageously can provide vapor-impermeable microencapsulation of the light emissive materials and/or nanomaterials.) While the method outlined in FIG. 2 refers quantum dots (QDs), the same steps can also be carried with any of the other light emissive materials and/or nanomaterials described herein. The Matrix Encapsulation step in FIG. 2 refers to exposing one or more light emissive materials and/or nanomaterials (e.g., QDs) to a precursor for forming a glass on the outer surface of one or more of such particles. The densification step comprises treating (e.g., thermally treating) the particles surrounded by the precursor to density or vitrify at least the outer surface of precursor surrounding the particle. Preferably all of the precursor surrounding the particle is vitrified or densified.

For applications in which air stability is desired, the oxygen stability of luminescent particles can be characterized by including the luminescent particles into a silicone or other oxygen permeable monomer, drawing a film thereof, and polymerizing the monomer film. (A non-reactive medium could be used as well.) The polymerized film is then irradiated with light from a source such as a 450 nm blue LED or laser, and the emission characterized by intensity, peak wavelength, FWHM, absorption, at a variety of different temperatures as regulated by a thermal management system. The temperature can be varied from room temperature to above 200° C. and the irradiance power varied from a flux density of 20 mW/cm2 to as high as 50 W/cm$^2$. These measurements can be tracked over time to ascertain the rates of change of product performance in order to develop an accelerated aging model.

A luminescent material comprising luminescent particles with preselected 02 stability, wherein one or more particles of light emissive material include quantum dots, can be useful as a color converting material that can be applied to the edge of an LED or otherwise included in an LED instead of the current phosphor to give all the optical color advantages of quantum dots with an ease of processing of an LED encapsulant.

A luminescent particle described herein can also be useful in LED fabrication to generate a white LED with high color gamut and efficiency.

In certain embodiments and aspects of the present invention described herein, the one or more particles of one or more light emissive materials comprise one or more particles of a one or more light emissive nanomaterials. Particles of a light emissive nanomaterial are preferably inorganic semiconductor nanocrystals (which may also be referred to herein as quantum dots) that are nanometer sized particles that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size.

Quantum dots can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

Examples of semiconductor materials that can be included in a quantum dot (including, e.g., semiconductor nanocrystal) include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core) shell.

Quantum dots can have various shapes, including, but not limited to, sphere, rod, disk, other shapes, and mixtures of various shaped particles.

One example of a method of manufacturing a quantum dot (including, for example, but not limited to, a semiconductor nanocrystal) is a colloidal growth process. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% runs (root-mean-square) in diameter and more preferably less than 10% rms and most preferably less than 5%.

An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained.

The narrow size distribution of the quantum dots or semiconductor nanocrystals allows the possibility of light emission in narrow spectral widths. Monodisperse semiconductor nanocrystals have been described in detail in Murray et al. (J. Am. Chem. Soc., 115:8706 (1993)) which is hereby incorporated herein by reference in its entirety.

Semiconductor nanocrystals and other types of quantum dots preferably have ligands attached thereto.

In certain aspects, it may be desirable to include inorganic ligands.

Preferably, ligands are selected that are chemically compatible with the precursor(s) that are used.

If the one or more particles of one or more light emissive materials and/or light emissive nanomaterials are further included in a host material within the luminescent material, the ligands are preferably selected to be chemically compatible with the host material and any other additives that may be included therein.

Ligands can be derived from a coordinating solvent that may be included in the reaction mixture during the growth process.

Ligands can be added to the reaction mixture.

Ligands can be derived from a reagent or precursor included in the reaction mixture for synthesizing the quantum dots.

In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

Examples of additional ligands include fatty acid ligands, long chain fatty acid ligands, alkyl phosphines, alkyl phosphine oxides, alkyl phosphoric acids, or alkyl phosphinic acids, pyridines, furans, and amines More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Useful quantum dots according to the present invention include those that emit wavelengths characteristic of red light. In certain preferred embodiments, quantum dots capable of emitting red light emit light having a peak center wavelength in a range from about 615 nm to about 635 nm, and any wavelength or range in between whether overlapping or not. For example, the quantum dots can be capable or emitting red light having a peak center wavelength of about 635 nm, about 630 nm, of about 625 nm, of about 620 nm, of about 615 nm.

Useful quantum dots according to the present invention also include those that emit wavelength characteristic of green light. In certain preferred embodiments, quantum dots capable of emitting green light emit light having a peak center wavelength in a range from about 520 nm to about 545 nm, and any wavelength or range in between whether overlapping or not. For example, the quantum dots can be capable or emitting green light having a peak center wavelength of about 520 nm, of about 525 nm, of about 535 nm, of about 540 nm or of about 540 nm.

The narrow emission profile of quantum dots of the present invention allows the tuning of the quantum dots and mixtures of quantum dots to emit saturated colors thereby increasing color gamut and power efficiency beyond that of conventional LED lighting displays. According to one aspect, green quantum dots designed to emit a predominant wavelength of, for example, about 523 nm and having an emission profile with a FWHM of about, for example, 37 nm are combined, mixed or otherwise used in combination with red quantum clots designed to emit a predominant wavelength of about, for example, 617 nm and having an emission profile with a FWHM of about, for example 32 nm. Such combinations can be stimulated by blue light to create trichromatic white light.

Luminescent particles described herein or made by a method described herein may be incorporated into a wide variety of other consumer products, including flat panel displays, computer monitors, all-in-one computers, notebooks, tablets, televisions, billboards, lights for interior or exterior illumination and/or signaling, heads up displays, fully transparent displays, flexible displays, laser printers, telephones, cell phones, smartphones, personal digital assistants (PDAs), laptop computers, digital cameras, camcorders, viewfinders, micro-displays, vehicles, a large area wall, theater or stadium screen, a sign, lamps and various solid state lighting devices.

Luminescent particles described herein or made by a method described herein can be excited optically and the optical excitation is down converted via emission from the light emissive particles, preferably, semiconductor nanocrystals. Such photoluminescence is useful in any device/system where a LED light source is used (e.g. solid-state lighting, LED Backlights (LED-BLU) Liquid Crystal Displays (LCD)). Such photoluminescence can also be useful any device/system where a light source is down converted to other wavelengths (e.g. solar concentrators or downconverters where sunlight is converted to specific wavelengths tuned to highest efficiency window of the solar cells used in the system; plasma based systems where high energy plasma emission can excite a semiconductor nanocrystal "phosphor"/downconverter; taggants; bio-labeling or imaging; barcoding or security/covert labeling applications).

Luminescent particles described herein or made by a method described herein described herein that preferably include light emissive particles comprising semiconductor nanocrystals can also be useful in applications such as, for example, photovoltaic (PV) applications in which the semiconductor nanocrystal materials are excited optically and the excitation results in current generation and/or a voltage due to carrier extraction from the semiconductor nanocrystals.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid. State Lighting Devices Including Quantum Confined Semiconductor Nanoparticles, An Optical Component for a Solid State Light Device, and Methods"; International Application No. PCT/US2010/32859 of Modi et al, filed 28 Apr. 2010 entitled "Optical. Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized. Nanoparticles And Method"; U.S. Pat. No. 6,600,175 of Baretz, et al., issued Jul. 29, 2003, entitled "Solid State White Light Emitter And Display Using Same"; and U.S. Pat. No. 6,608,332 of Shimizu, et al., issued Aug. 19, 2003, entitled "Light Emitting Device and Display"; and U.S. patent application Ser. No. 13/762,354 of Nick, et al., filed 7 Feb. 2013, entitled "Methods of Making Components Including Quantum Dots, Methods, and Products"; each of the foregoing being hereby incorporated herein by reference in its entirety.

As used herein, the singular forms "a", "an" and "the" include plural unless the context clearly dictates otherwise. Thus, for example, reference to an emissive material includes reference to one or more of such materials.

Applicant specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A luminescent particle including a surface comprising glass that surrounds one or more particles of one or more light emissive nanomaterials; wherein the particles are encapsulated in a host material and the glass surrounds the encapsulated particles; and wherein the light emissive nanomaterials are present in an amount of 0.05 to 10 weight percent of the host material.

2. A luminescent particle in accordance with claim 1 wherein the luminescent particle comprises one or more particles of one or more light emissive nanomaterials distributed in glass.

3. A luminescent particle in accordance with claim 1 wherein at least one of the light emissive nanomaterials comprises quantum dots.

4. A luminescent particle in accordance with claim 1 wherein at least one of the light emissive nanomaterials comprises a nanophosphor.

5. A luminescent particle in accordance with claim 1 wherein the glass comprises a metal oxide.

6. A luminescent particle in accordance with claim 1 wherein the glass is derived from a fumed metal oxide.

7. A luminescent particle in accordance with claim 5 wherein the glass is formed by pyrolysis.

8. A luminescent particle in accordance with claim 1 wherein the glass comprises silica.

9. A luminescent particle in accordance with claim 1 wherein the glass is free or substantially free of graphitization by-products.

10. A luminescent particle in accordance with claim 1 wherein the particle has a smallest dimension in a range from about 5 nm to about 200 microns.

11. A luminescent particle in accordance with claim 1 wherein the particle includes two or more particles of one or more light emissive nanomaterials.

12. A luminescent particle in accordance with claim 11 wherein the glass is free or substantially free of graphitization by-products.

13. A light emitting device comprising a luminescent particle in accordance with claim 1.

* * * * *